United States Patent [19]

Harp et al.

[11] 4,122,391

[45] Oct. 24, 1978

[54] FREQUENCY DEVIATION MEASURING AND ADJUSTING SYSTEM

[75] Inventors: Maurice C. Harp, Belmont; Terry R. Seaver, Mountain View, both of Calif.

[73] Assignee: GTE Automatic Electric Laboratories Incorporated, Northlake, Ill.

[21] Appl. No.: 834,754

[22] Filed: Sep. 19, 1977

[51] Int. Cl.$^2$ ............................................. G01R 23/02
[52] U.S. Cl. .................................. 324/78 Z; 324/79 R
[58] Field of Search ............... 324/78 Z, 79 R, 79 D, 324/78 R; 328/141; 331/14, 1 A, 18, 19, 25

[56] References Cited

U.S. PATENT DOCUMENTS 3,549,997  12/1970  Rotzel ............................. 324/79 D
3,893,040  7/1975   Harp ................................ 331/18

Primary Examiner—M. Tokar
Attorney, Agent, or Firm—Leonard R. Cool

[57] ABSTRACT

A calibrated unipolar signal is used to deviate a frequency modulator by a predetermined amount $\Delta f$ from a carrier $f_2$. An automatic frequency control circuit operates to bring the carrier back on frequency and a meter connected in the control circuit will read this departure from normal. During the test for correct deviation, a frequency shifter compensates for the predetermined frequency deviation and the meter would so indicate, e.g., would not change reading from that of carrier alone, if the deviation caused by the calibrated unipolar signal is equal to that incorporated in the frequency shifter. If the reading does change, the modulation sensitivity of the frequency modulator is adjusted until the readings before test (using carrier only) are the same as those under test.

11 Claims, 7 Drawing Figures

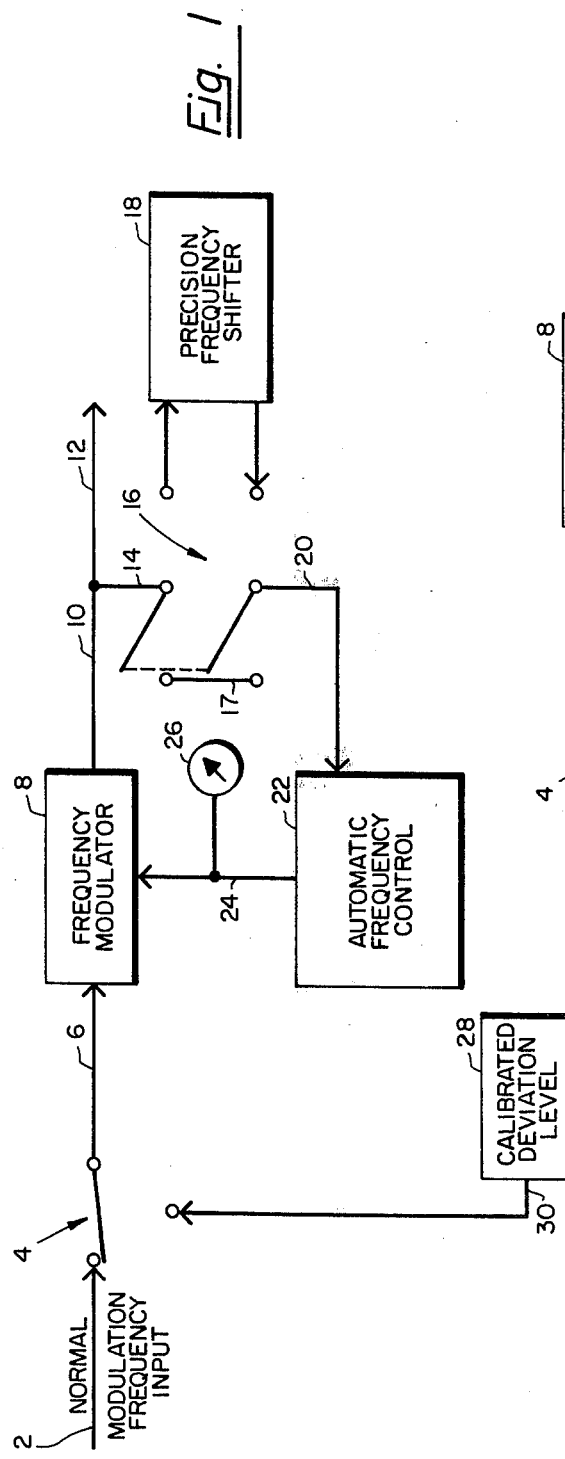
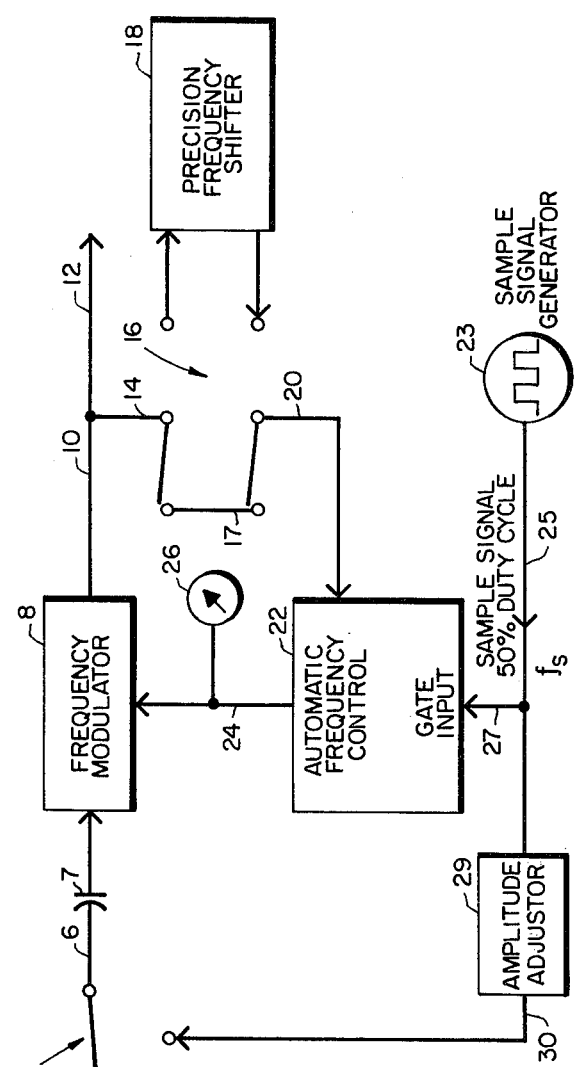
Fig. 1
Fig. 2

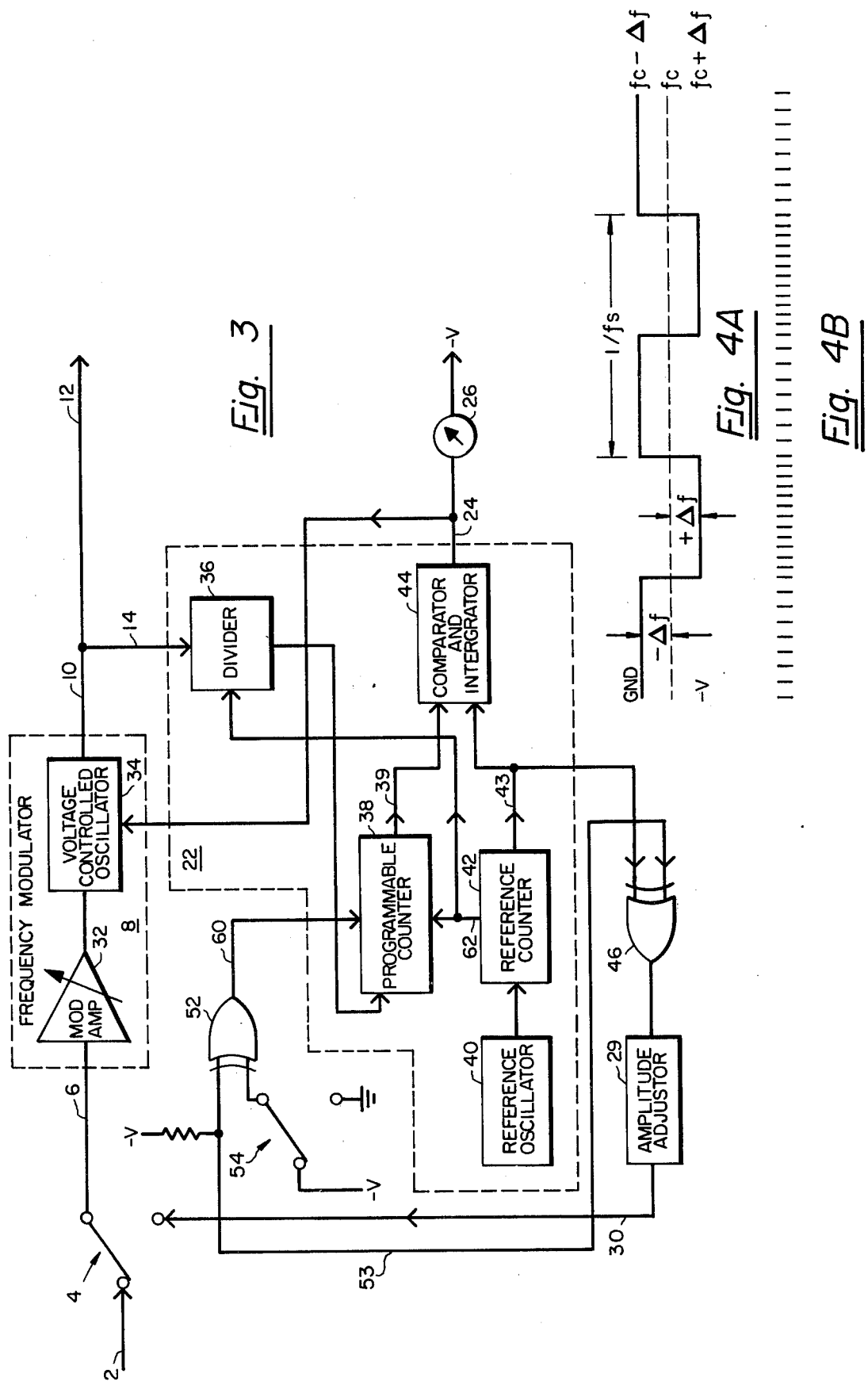

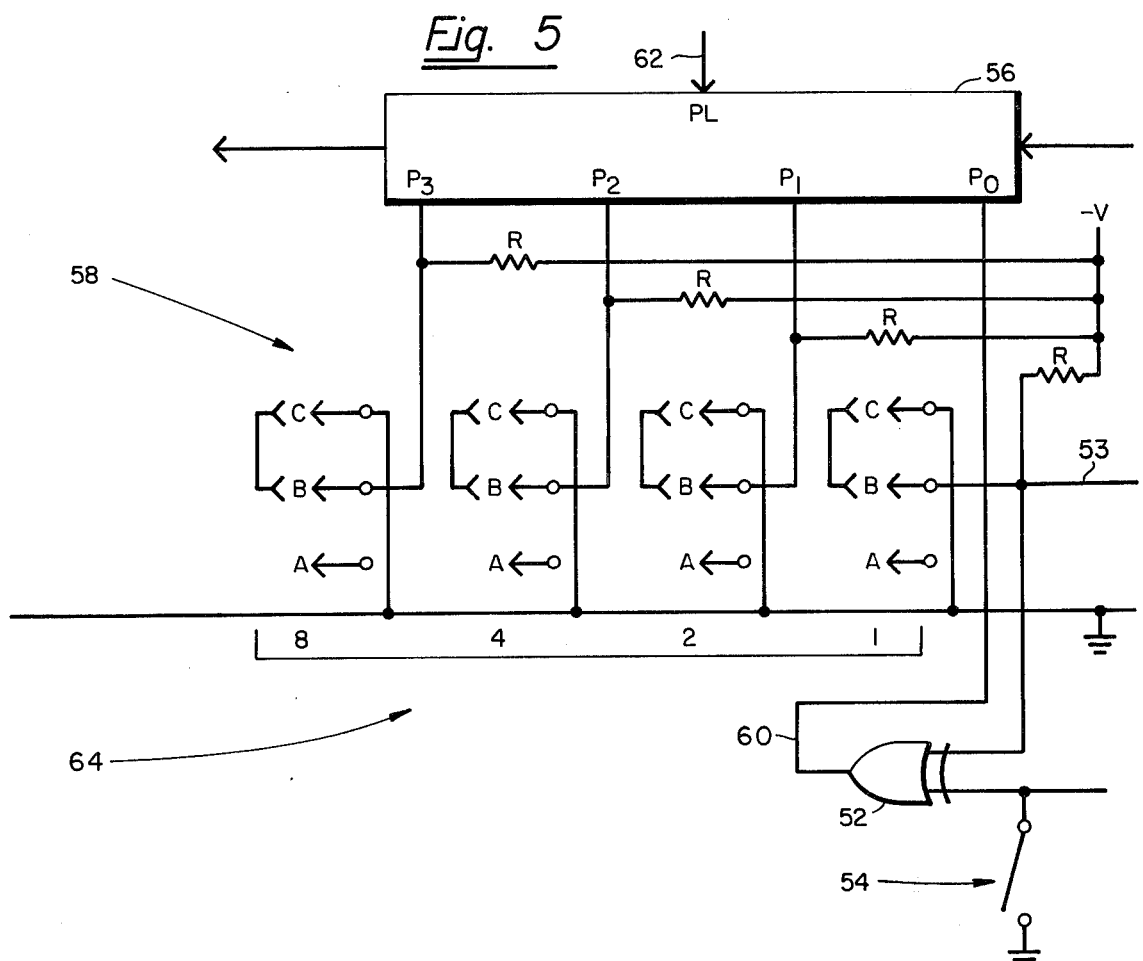
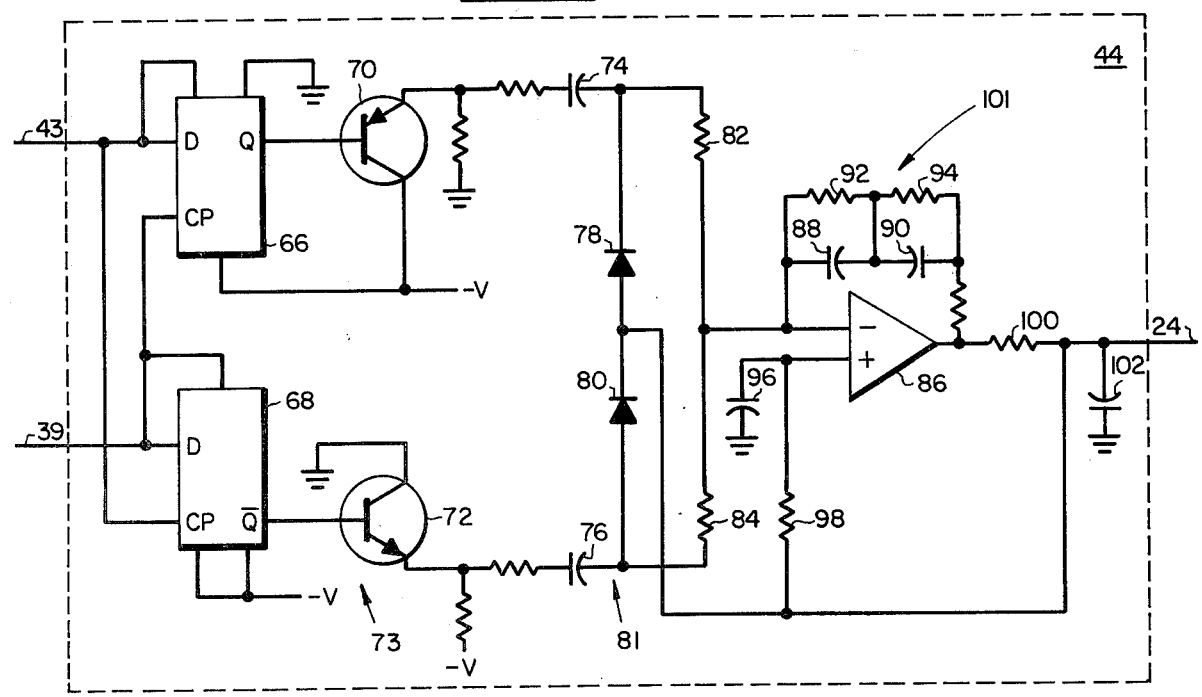

FREQUENCY DEVIATION MEASURING AND ADJUSTING SYSTEM

BACKGROUND OF THE INVENTION

1. Field of the Invention

The present invention relates in general to frequency modulation measurement and more particularly to a novel method and apparatus for accurately testing and adjusting the modulation sensitivity and, hence, the frequency deviation of frequency modulated radio frequency generators.

2. Description of the Prior Art

A technique for measuring the frequency deviation of a frequency-modulated generator is disclosed in U.S. Pat. No. 3,071,726, issued Jan. 1, 1963, inventor B. E. Nelson, in which the Bessel zero or carrier null technique is disclosed. This technique is based on the fact that the RF carrier voltage amplitude goes to zero when the frequency modulation index equals 2.405. The modulation index is defined as $M_f = \Delta f/f_s$ where $\Delta f$ is the peak frequency deviation; and $f_s$ is the modulation frequency. At the carrier null condition $\Delta f/f_s = 2.405$. The amplitude of the modulation frequency is increased from zero amplitude to an amplitude at which the carrier shrinks to zero amplitude thereby making the modulation index $M_f$ equal to 2.405. By measuring the amplitude $V_s$ of the modulation frequency $f_s$ at the carrier null condition, the modulation sensitivity $\Delta f/V_s$ of the frequency modulator is determined.

Such a technique, as is disclosed in U.S. Pat. No. 3,071,726, requires the use of a modulation frequency having an adjustable amplitude so as to drive the RF carrier voltage to zero and, also, requires some device for measuring the RF carrier output voltage during the measurement period, thus, separate expensive test equipment is required to implement this technique.

Another frequency deviation measuring system is disclosed in U.S. Pat. No. 3,549,997, issued Dec. 22, 1970, inventor D. Rotzel, wherein a frequency modulated signal and a reference signal are separately used to derive zero crossing pulses which are separately coupled to counters via gates. The frequency modulated signal is additionally coupled to a pulse shaper via a discriminator which generates a pulse which opens the gates to initiate counting. Each gate is separately closed by its associated counter when a predetermined count is reached for that counter. The time elapsing between the closing of the respective gates is a measure of the frequency deviation. The time is measured by coupling the gate closing signals via an Exclusive-OR gate to another gate which allows pulses from a timing pulse generator to reach a direct reading counter. One problem with this technique is that the time measurement will vary depending upon whether the frequency modulated signal is started during its positive half-cycle when its frequency will be greater than that of the reference frequency, or whether it is started during the negative half-cycle when its frequency will be less than the reference frequency. In order to reduce the effects of the short time fluctuations, the deviation must be determined by taking an average value of the measurements.

SUMMARY OF THE INVENTION

For a frequency modulation system including a frequency modulator, an automatic frequency control circuit and a measuring device connected therein, a technique for testing and adjusting the frequency deviation of the frequency modulator comprising; applying to an input of the frequency modulator a calibrated deviation signal which shifts the output frequency of the frequency modulator a predetermined amount when the modulation sensitivity is properly adjusted; applying the frequency modulated output to a frequency shifter which shifts the output frequency by said predetermined amount but in a direction opposite from that caused by the calibrated deviation signal; and, applying the frequency shifted signal to the automatic frequency control circuit. If the modulation sensitivity of the frequency modulator is correctly adjusted, the measuring device should give the same indication during the test as it did during the normal operation, e.g., carrier output only. Otherwise, the measuring device will give a different indication. In this latter case, the modulation sensitivity of the frequency modulator is adjusted until both the normal indication and the indication during test are substantially the same.

BRIEF DESCRIPTION OF THE DRAWINGS

The above-mentioned feature and other characteristics of this invention will become apparent by reference to the following description in conjunction with the accompanying drawings wherein:

FIG. 1 is a block diagram of one embodiment of the invention;

FIG. 2 is a block diagram of a second embodiment of the invention;

FIG. 3 is a block diagram of a third embodiment of the invention;

FIG. 4A is a waveform diagram illustrating the general characteristics of the calibrated deviation signal $f_s$ employed with the embodiment of FIG. 3 and the effect on the output of the frequency modulator;

FIG. 4B is a waveform illustrating graphically the frequency change involved between $f_c - \Delta f$ and $f_c + \Delta f$ as illustrated in FIG. 4A;

FIG. 5 is a circuit diagram illustrating the decade of the programmable counter 38 in which the program is shifted for test or adjustment purposes; and FIG. 6 is a circuit diagram illustrating the comparator and integrator 44 used with the embodiment illustrated in FIG. 3.

DESCRIPTION OF THE PREFERRED EMBODIMENTS

A first embodiment of the invention is illustrated in FIG. 1. Note during normal operation of the frequency modulator, switch 4 is connected so that paths 2 and 6 are interconnected providing the normal modulation frequency input signal to the input path 6 of frequency modulator 8. The frequency modulated output appears at path 10 and would then be applied via path 14, switch 16 through path 17, and path 20 to the automatic frequency control circuit (AFC) 22. Automatic frequency control circuits are well known and it is known that such circuits would apply a control signal, e.g., on path 24 to frequency modulator 8. Automatic frequency control circuit 22 may be of the digital type and one such is illustrated in U.S. Pat. No. 3,893,040, issued July 1, 1975, and entitled, "Digital Automatic Frequency Control System" by Maurice C. Harp. The control signal 24 is also applied to meter 26. This meter will give an indication of the correction required of the automatic frequency control circuit to maintain the carrier on frequency. In practice, a zero-center meter would be employed and in normal operation the meter reading would be near zero. For this invention, meter 26 may be a panel type meter and high accuracy is not required since, during the test, successive readings are compared and, when the deviation is correctly adjusted, the two readings will be essentially the same. Thus, it is only significant that the meter will read the same or approximately the same each time that a signal of the same level is applied to its input.

To check the frequency deviation, the reading of meter 26 is first noted with the switch 4 in the position shown in FIG. 1. Then the switch 4 is connected so that a fixed DC level is applied from calibrated deviation level 28 over path 30, switch 4 and path 6 to the input of frequency modulator 8. At the same time, switch 16 is changed in position so as to interconnect the frequency shifter 18 between paths 14 and 20, so that the frequency modulated output from frequency modulator 8 via path 10 passes through frequency shifter 18 before it arrives at the input of AFC 22.

The output voltage on path 30 is calibrated so as to provide a peak deviation of $+\Delta f$ or $-\Delta f$ at the output of frequency modulator 8 if the modulation sensitivity of modulator 8 is correctly adjusted. The calibrated deviation signal may be derived from AFC 22 as will be disclosed hereinafter, or it may be separately generated.

The function of frequency shifter 18 is to accept the deviated signal along path 14 and provide at its output on path 20 the original carrier frequency, assuming that the modulation sensitivity of frequency modulator 8 is correctly adjusted. To accomplish this result, frequency shifter 18 would include, for example, an oscillator having a frequency $\Delta f$, a product modulator so that the sum and difference frequencies may be obtained, and a selection means, such as a band pass filter, for selecting just the carrier from the product output of the modulator. Such techniques are well known and are not described in detail here. It is apparent that, if the frequency modulated output from modulator 8 is not deviated by the predetermined amount, the frequency appearing on path 20 will not be the original carrier frequency $f_c$, but will be different from that by the difference determined in the modulation process in frequency shifter 18. The automatic frequency control circuit 22 will then operate to shift the frequency of the carrier in the frequency modulator 8 and the control signal on path 24 will change. This change will be indicated by meter 26 and so it will be apparent that the frequency deviation is not proper and that the modulation sensitivity of frequency modulator 8 must be adjusted. This would be accomplished by switching switch 4 to the normal position and switch 16 to the short position where path 17 is included rather than frequency shifter 18, adjusting the modulation sensitivity, and then shifting back into the test position to determine if the adjustment is correct. This would be repeated until the meter reading is either unchanged for the two conditions or is substantially the same.

A second embodiment of the invention is shown in FIG. 2. The elements and paths which remain essentially unchanged from those shown in FIG. 1 are given the same designations and item numbers. It is to be noted that the embodiments of FIGS. 1 and 2 are quite similar, but there are important differences. Because of the similarities, only the differences are discussed, since operation otherwise is clear from the above description for FIG. 1. Rather than using the fixed dc voltage on the frequency modulation input path 8, a time varying modulation frequency is employed. In this embodiment, a square wave is preferred because it causes the modulator 8 output frequency to deviate the peak amount $+\Delta f$ and $-\Delta f$ from the carrier $f_c$, as is shown in FIG. 3A. In FIG. 2 the modulation frequency generator is derived from signal sample generator 23. However, as will be shown and described with respect to FIG. 3, the modulation frequency $f_s$ may be obtained from AFC 22. The amplitude of the modulation frequency $f_s$ is set by amplitude adjustor 29 to obtain a calibrated modulation frequency, i.e., a modulation frequency at an amplitude at which the deviation will be a predetermined amount, i.e., $\Delta f$, if the modulation sensitivity of the frequency modulator is correctly adjusted. By using a time varying modulation frequency $f_s$, operation of frequency modulator 8 is similar to that obtained by use of the normal modulation frequency input signals. Capacitor 7 has been added to emphasize this difference, since AC operation is most generally employed. Because of the use of the square wave, or unipolar, modulating frequency $f_s$, it is necessary to compare the frequency modulated output from modulator 8 with a reference frequency in AFC 22 only during one-half of the square wave cycle. Otherwise, as is readily apparent the average frequency at the output of frequency modulator 8 would be the carrier $f_c$, as shown in FIG. 4A. One manner in which the gate input may be employed to effect the appropriate comparison is to cause AFC 22 to operate only during a predetermined period. One such technique is discussed in detail with respect to FIG. 3 below.

A third embodiment of the invention is illustrated in FIG. 3. The elements and paths which remain essentially unchanged from those shown in FIGS. 1 and 2 are given the same designations and item numbers. Frequency modulator 8 is shown in a slightly different configuration in that a modulation amplifier 32, which is adjustable, is employed to change the modulation sensitivity of frequency modulator 8, and the frequency modulated oscillator often called, "FMO", is shown as voltage controlled oscillator (VCO) 34. Such an arrangement of the frequency modulator 8 could also be employed in the embodiments shown in FIGS. 1 and 2. Frequency modulators, which employ modulation amplifiers and voltage controlled oscillators, are well known and are not further described. The basic differences between the circuit shown in FIG. 3 and that shown in FIG. 2 are that a digital AFC circuit is employed in item 22 and, further, that the digital AFC circuit uses a programmable counter 38. Also, it should be noted that the calibrated deviation signal is derived from the digital AFC circuit and the frequency shifter is not employed. However, the frequency is essentially shifted by changing the program of one decade of the programmable counter 38. Thus, considerable simplification results from the use of a digitally programmed AFC circuit.

In making the deviation check or adjustment, meter 26 again is observed when switch 4 is in the position to pass the normal frequency signals via path 6 into modulation amplifier 32. Once this is noted, switch 4 and switch 54 are switched, and these may be ganged, so that the frequency modulator 8 receives the calibrated modulation frequency via reference oscillator 40, reference counter 42, EX-OR gate 46, amplitude adjustor 29, path 30, switch 4 and path 6. The output square wave signal from gate 46 has a 50% duty cycle and is adjusted or calibrated in amplitude adjustor 29 before being applied to the input of frequency modulator 8. It is understood that amplitude adjustor 29 may be nothing more than a fixed selected resistor, or it may be a potentiometer which is appropriately adjusted. The calibrated modulation frequency will then deviate frequency modulator 8 as previously discussed. The frequency modulated output, i.e., deviated signal, is applied to divider 36 which scales the output frequency, if necessary, so as to put it in the range of the programmable counter 38. Divider 36 may or may not be required depending upon the frequency of operation and the range of programmable counter 38. The output of divider 36 is applied to the input of the first or lowest decade of programmable counter 38 which, as is well known, may be programmed to provide the desired frequency output. Stating this in another way, the programmable counter is programmed so that for a frequency equal to the reference frequency at the output path 10 of frequency modulator 8, the pulse repetition rate on path 39 out of programmable counter 38 would be equal to the pulse repetition rate from reference counter 42 on path 43. This is determined by a simple calculation. It is apparent that an advantage of the arrangement here is that a programmable counter permits the operation of this circuit with different carrier frequencies without the need to replace the digital AFC circuit.

At the time that the predetermined deviation signal is applied to frequency modulator 8, switch 54 is connected to the ground connection so that Exclusive-OR gate 52 will provide an output signal on path 60 which will change the count of programmable counter 38 so that the output on path 39 will be unchanged provided the modulation sensitivity adjustment of frequency modulator 8 is correct. This is illustrated in more detail in FIG. 4.

Accuracy of the digital AFC, as well as the check and adjusting circuit, depends upon an accurate and stable reference oscillator 40. Such oscillators are well known and will not be described in detail here. The reference oscillator 40 would not necessarily be at the same frequency as the voltage controlled oscillator 34 and thus, the counting function is used to bring outputs on paths 39 and 43 to the same pulse repetition rate when the voltage controlled oscillator 34 is on frequency.

The reference counter 42 has two outputs, the sample signal output on path 43 and the load pulse output on path 62. The sample signal is a square wave. On the negative going edge of the sample signal the sample period starts. The sample period ends at or near the rising edge of the sample signal. During the sample period, the reference frequency and the frequency modulated output signal from modulator 8 are being counted by their respective counters. If the output carrier frequency is at exactly the programmed value, the output of the programmable counter on path 39 and the reference counter on path 43 will go to a logic high level simultaneously. If the carrier frequency is in error, the output of the programmable counter will rise before or after the output of the reference counter goes high. The load pulse on path 62 is a negative going pulse that occurs just prior to the start of the sample period. The load pulse parallel loads the program counter with the desired carrier frequency and presets the divider 36.

One decade element of programmable counter 38 is shown as 56 in FIG. 5. The decade element shown has four straps for adjustment. These can be connected so as to represent a four-bit binary coaded decimal (BCD) digit of the desired carrier frequency. Each decade element may be adjusted using BCD code between 0 and 9 and, thus, a plurality of the decade elements would represent the carrier frequency in powers of 10. The decade counters are synchronous devices which prevent propagation delay differences from component-to-component and due to temperature changes from effecting the timing stability of the programmable counter. The programmable counter straps may be set to the exact carrier frequency desired. Referring to the straps 58 of FIG. 5, each digit of the desired carrier frequency is programmed using a binary coded decimal (BCD) numbering system. Each group of straps, and only one group is shown in FIG. 5, contains 4 straps representing a binary number from zero through 9. The right most strap in each group represents a multiplier of 1, as shown below the strap group, the next step to the left represents a multiplier of 2, the next to the left is times 4 and the next is times 8. If a strap is in the upper position (terminals B and C connected), the strap's appropriate multiplier is at a logical 1. If a strap is in the lower position (terminals A and B connected), its multiplier is at a logical zero. To determine the decimal value of a group of straps simply add the values of the multipliers whose straps are in the group or logical one position. A digit 6 would be represented by the BCD 0110, which would means tht the right most strap of the four straps was in the lower, logic zero position, the second and third straps from the right were in the high, logic one positions, and the left most strap was in the lower, logic zero position. The multipliers 2 and 4 are added together to form a digit 6. Following the rationale disclosed above, it is apparent that EX-OR gate 52 will operate to shift the frequency, the programmed frequency, of the programmable counter by a factor of 1 when switch 54 is closed. To operate properly, it is only necessary that the programmed frequency be equivalent to the frequency deviation $\Delta f$ to be generated by frequency modulator 8 when the modulation sensitivity is properly adjusted, but the programmed frequency must be in the opposite direction from that of the frequency diviation $\Delta f$ to compensate for the deviation and to provide an output on path 39 which is essentially unchanged. This is accomplished by the connection of path 53 to EX-OR gate 52 and EX-OR gate 46. Any difference in the output frequency on path 39 from that on path 43 would be dependent upon the modulation sensitivity adjustment, and this then could be controlled so as to properly adjust the deviation by using meter 26 and the test method as disclosed above.

The control signal on path 24 is derived from comparator and integrator circuit 44 as shown in FIG. 6. The comparator 73 consists essentially of D-type flip-flops 66 and 68 and current buffering transistors 70 and 72. The comparator 73 compares the programmed counter output 39 to the reference counter output 43 at the end of the sample period. If the output carrier frequency is to high, the output of the programmed counter 38 will rise to a logical 1, before the output of reference counter 42 rises to a logical 1, and a negative going pulse will occur at the Q-output of flip-flop 66. The width of the pulse will be proportional to the amount of carrier frequency error. If the output carrier frequency is too low, the programmed counter output on path 39 will rise after the occurrence of reference counter output on path 43, and a positive going pulse will occur at the Q-output of flip-flop 68, the pulse width again being proportional to the amount of carrier frequency error. Transistors 70 and 72 provide current buffering for the comparator 73 outputs, and make the output impedances of the comparator — buffer circuit equal. Rectifier 81 consisting essentially of capacitors 74 and 76 and diodes 78 and 80 rectify the pulse outputs from the comparator 73. The rectified error pulses are fed to the inverting input of integrator 101 consisting of operational amplifier 86 and associated circuitry. The non-inverting input of OP-AMP 86 and rectifier 81 are referenced to the output of OP-AMP 86, so that the entire integrator 101 floats about its own output. The buffered outputs of comparator 73, in conjunction with rectifier 81, act as a charge pump, allowing the error pulses to add or substract charge from the integrator capacitors 88 and 90. The integrator amplifier (OP-AMP 86) has a very high DC voltage gain because of positive feedback. Because the gain is very high, and the error pulse duty cycle is very low, about 0.0001%, the integrator operational amplifier 86, must have a very low input current. For this reason, a high-performance FET input operational amplifier preferably is used for the integrator amplifier 86. Resistor 98 and capacitor 96 and resistor 100 and capacitor 102 form lowpass filters to prevent oscillations of the integrator 101. Resistors 92 and 94 are bleed-off resistors that help prevent charge differences on capacitors 88 and 90. Resistors 92 and 94 and capacitors 88 and 90 set the time constant of the integrator 101, which preferably is about 200 seconds. A unity gain buffer amplifier may be incorporated between the output of the integrator and the control voltage output on path 24.

While the invention has been particularly shown and described with reference to preferred embodiments thereof, it will be understood by those skilled in the art that changes in form and detail may be made therein without departing from the spirit and scope of the invention.

What is claimed is:

1. Apparatus for checking the frequency deviation $\Delta f$ of a carrier frequency $f_c$ in a frequency modulation system comprising:
    frequency modulator means, including an adjustable modulation amplifier for adjusting the modulation sensitivity and a voltage controlled frequency modulated oscillator operating at the carrier frequency $f_c$, said frequency modulator means having a modulation frequency input path, an oscillator frequency control input and having an output, whereby frequency deviation of the carrier $f_c$ is obtained at said output when a modulation frequency is applied to the modulation frequency input;
    means for applying to said modulation frequency input path a calibrated modulation frequency $f_s$ having an amplitude such that a predetermined peak frequency deviation $\Delta f$ will be obtained at the output of said frequency modulator means if the modulation sensitivity is properly adjusted;
    means for changing the frequency of the frequency deviated signal said predetermined amount, but in the opposite direction so that the original diviation will be effectively cancelled if the modulation sensitivity is properly adjusted, said changing means having an input connected to the output of said frequency modulator means and having an output;
    means for automatically controlling the frequency of the voltage controlled oscillator by supplying from an output a control signal to the oscillator frequency control input of the frequency modulator means, said controlling means having an input connected to the output of said changing means; and
    measuring means having an input connected to the output of said automatic controlling means, for providing an indication of the frequency diviation.

2. Apparatus in accordance with claim 1 wherein said means for changing the frequency comprises:
    oscillator means having an output, said oscillator means generating a frequency equal to the frequency $\Delta f$ of the predetermined peak frequency deviation;
    modulator means having as a first input the deviated signal output of said frequency modulator means, having as a second input the output of said oscillator means, said modulator means providing modulation frequencies which include a frequency $f_x$ near the carrier frequency $f_c$ at an output, said frequency $f_x$ will be equal to $f_c$ if the modulation sensitivity is properly adjusted; and
    means for selecting the frequency $f_x$ for automatic control of the voltage controlled oscillator, said selecting means having an input connected to the output of said modulator means and having an output connected to the input of said controlling means.

3. Apparatus in accordance with claim 1 wherein said means for changing the frequency comprises:
    a programmable counter programmed for said carrier frequency $f_c$; and
    means for altering the counter program by said predetermined peak frequency deviation.

4. Apparatus for checking the frequency deviation of a carrier frequency $f_c$ of a frequency modulated signal comprising:
    frequency modulator means having a modulation frequency input, having a control input and having an output, whereby frequency deviation of the carrier $f_c$ is obtained when a modulation frequency is applied to the modulation frequency input;
    means for applying to said modulation frequency input a calibrated modulation frequency $f_s$ hving an amplitude such that a predetermined peak frequency deviation will be obtained if the modulation sensitivity of the frequency modulator means is properly adjusted;
    program gating means having an output;
    digital automatic frequency control means having an output connected to the control input of said frequency modulator, having an input connected to the output of said frequency modulator means, having a programmable counter connected to said input, having a programmed input connected to the output of said program gating means, whereby said programmable counter will provide an equivalent of the carrier frequency $f_c$ when said program gating means is in one binary state and a frequency different from $f_c$ by $\Delta f$ when in the other said state the latter frequency being in a direction such as to correct for the effect of the peak frequency deviation $\Delta f$ caused by the calibrated modulation frequency $f_s$ when the modulation sensitivity is correctly adjusted; and
    measuring means having an input connected to the output of said frequency control means, said measuring means providing an indication of the frequency deviation.

5. Apparatus in accordance with claim 4 wherein said frequency modulator comprises:

a modulation amplifier having a modulation frequency input, having an output, said modulation amplifier having controllable gain for adjustment of the modulation sensitivity of the frequency modulator; and a voltage controlled frequency modulation oscillator having one input connected to the output of said modulation amplifier having a control input connected to the output of said digital automatic frequency control means, and having an output.

6. Apparatus in accordance with claim 5 wherein said digital automatic frequency control means further comprises:

a reference oscillator having an output;

a reference counting means having an input connected to the output of said reference oscillator, said reference counting means providing a reference pulse repetition rate at an output;

compare and integrate means having an output connected to the control input of said controlled voltage oscillator, having a first input connected to the output of said reference counting means, and having a second input connected to the output of said programmable counting means, said compare and integrate means providing a control signal for automatically controlling the frequency of said controlled oscillator, and for providing an input to said measuring means.

7. Apparatus in accordance with claim 6 wherein said means for applying comprises:

a first gating means having a first input connected to the output of said reference counting means, having a second input connected to said programmed gating means, said gating means controlling the phase of the reference counting means appearing at its output; and amplitude adjustment means having an input connected to the output of said gating means, said adjustment providing a calibrated modulation frequency to an output path.

8. Apparatus in accordance with claim 7 wherein said program gating means comprises:

a second gating means having one input connected to a reference voltage source, having a second input and having an output connected to an input of said programmable counter;

switching means for disconnecting the input of the frequency modulator from the normal signal modulation frequency path and connecting the calibrated modulation frequency to the modulation frequency input of said frequency modulator; and means for connecting a second voltage reference source to said second input of said second gating means whereby the output changes state.

9. Apparatus for adjusting the frequency deviation of a carrier frequency $f_c$ of a frequency modulated signal comprising:

a frequency modulator having a modulation frequency input path, having a control input path and having an output path whereby frequency deviation of the carrier $f_c$ is obtained when a modulation frequency is applied to the modulation frequency input path, said frequency modulator including means for adjusting the modulation sensitivity;

digital automatic frequency control means having an input path connected to the output path of said frequency modulator, having a first output path connected to the control input of said frequency modulator and providing a reference frequency at a second output, said digital automatic frequency control including a programmable counter which is programmed for normal operation with the carrier frequency $f_c$ and having a selected program input path, whereby for a binary input signal of one state on said input path normal operation is obtained and for a binary input signal of the other state the programmable counter is set to operate with an effective carrier which is different from $f_c$ by predetermined deviation frequency $\Delta f$;

modulation frequency means having an input connected to the reference frequency output of said digital automatic frequency control means and having an output, said modulation frequency means providing at said output a calibrated unipolar signal having an amplitude such that a predetermined peak frequency deviation $\Delta f$ will be obtained from said frequency modulator if the modulation sensitivity is properly adjusted;

a first switching means having a first terminal connected to the modulation frequency input of said frequency modulator, having a second terminal connected to the through modulation path and having a third terminal connected to the output of said modulation frequency means, whereby said modulation frequency input is connected to the through modulation path when the first switching means is in one state and is connected to said output of the modulation frequency means when the first switching means is in an other state;

program gating means having a first input connected to a first voltage source, having a second input and having an output path connected to the selected program input path of said programmable counter, whereby the binary signal on said output path shifts the counter by the equivalent of $\Delta f$ when in one binary state;

second switching means having one terminal thereof connected to a second reference voltage and having a second terminal thereof connected to the second input of said program gating means, whereby operation of said switching means from one state to the other state connects said second reference voltage to the second input and changes the state of the binary signal on the output path; and measuring means having a first input connected to the first output of said digital automatic frequency control, having a second input connected to said first voltage source, said measuring means providing a first indication when said switching means is in said other state, said measuring means providing a second indication when said first and second switching means are in said other state, said modulation sensitivity being adjusted so that the first and second indications are substantially the same.

10. A method of checking the modulation sensitivity of a frequency modulator consisting of the steps of:

measuring the amplitude of the automatic frequency control signal during normal operation of the frequency modulator;

switching from normal to a test mode to apply a calibrated modulation frequency to the modulation input of the modulator;

shifting the frequency of the modulated carrier by a fixed amount and in a direction opposite to that effected by the calibrated modulation frequency; and again measuring the amplitude of the automatic frequency control signal during the test operation, whereby the difference between the normal amplitude and the test amplitude is determined.

11. A method of adjusting the frequency deviation of a frequency modulator consisting of the steps of:

first, measuring the amplitude of the automatic frequency control signal during normal operation of the frequency modulator;

second, switching from normal to the test mode to apply a calibrated modulation frequency to the modulation input of the modulator;

third, shifting the frequency of the modulated carrier a fixed amount and in a direction opposite to that effected by the calibrated modulation frequency;

fourth, measuring the amplitude of the automatic frequency control signal during the test operation;

fifth, adjusting the modulation sensitivity; and repeating the first through fifth steps until the measurements during the first and fourth steps are substantially the same.

* * * * *

UNITED STATES PATENT AND TRADEMARK OFFICE
CERTIFICATE OF CORRECTION

PATENT NO. : 4,122,391
DATED : October 24, 1978
INVENTOR(S) : Maurice C. Harp & Terry R. Seaver It is certified that error appears in the above-identified patent and that said Letters Patent are hereby corrected as shown below:

In the Abstract, line 3, "$f_2$" should read -- $f_c$ --; line 9, "e.g." should read -- i.e. --.

Column 6, line 24, "group" should read -- upper --; line 26, "means tht" should read -- mean that --; line 66, "Q-output" should read -- $\overline{Q}$-output --.

Signed and Sealed this

Sixth Day of March 1979

[SEAL]

Attest:

RUTH C. MASON
*Attesting Officer*

DONALD W. BANNER
*Commissioner of Patents and Trademarks*